(12) United States Patent
Knotter et al.

(10) Patent No.: US 6,703,270 B2
(45) Date of Patent: Mar. 9, 2004

(54) METHOD OF MANUFACTURING A SEMICONDUCTOR DEVICE

(75) Inventors: Dirk Maarten Knotter, Nijmegen (NL); Peter Van Der Velden, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/906,602

(22) Filed: Jul. 17, 2001

(65) Prior Publication Data

US 2002/0013035 A1 Jan. 31, 2002

(30) Foreign Application Priority Data

Jul. 19, 2000 (EP) .............................. 00202591

(51) Int. Cl.[7] .................. H01L 21/8238; H01L 21/336; H01L 21/76; H01L 21/304; H01L 21/461
(52) U.S. Cl. ................... 438/221; 438/296; 438/425; 438/426; 438/424; 438/435; 438/437; 438/692; 438/697
(58) Field of Search ................ 438/697, 424, 438/425, 426, 435, 437, 296, 221, 692; 148/DIG. 50

(56) References Cited

U.S. PATENT DOCUMENTS 5,837,612 A    11/1998    Ajuria et al. ............... 438/697
6,039,631 A    3/2000    Sato et al. .................. 451/37

FOREIGN PATENT DOCUMENTS

EP    0461498 A2    12/1991
EP    0961315 A1    12/1999

*Primary Examiner*—David E. Graybill
(74) *Attorney, Agent, or Firm*—Aaron Waxoer

(57) ABSTRACT

A method of manufacturing a semiconductor device comprises the steps of:

Figure 1:
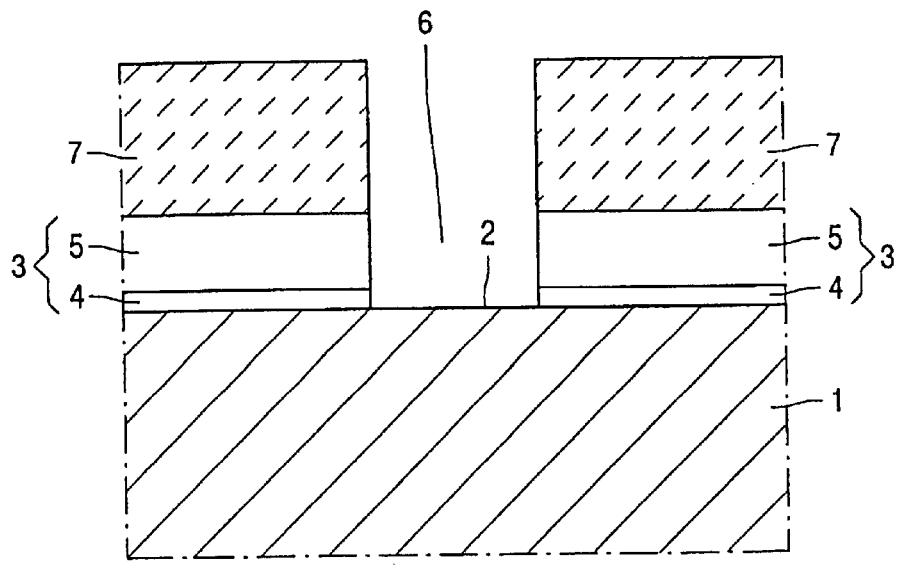
Figure 2:
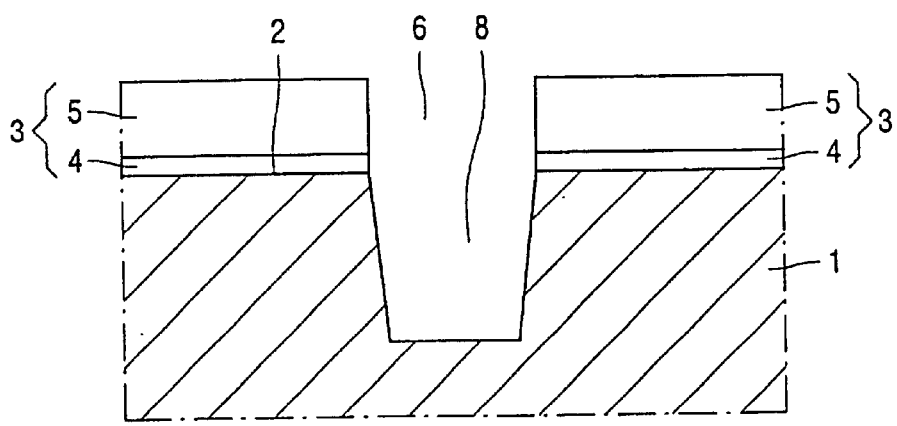

forming a patterned masking layer (3) of insulating material at a surface (2) of a semiconductor body (1), etching the semiconductor body (1) through the patterned masking layer (3) so as to form a trench (8) in the semiconductor body (1), applying an insulating layer (10) which fills the trench (8) in the semiconductor body (1), the insulating layer (10) exhibiting a trough (11) above the trench (8), which trough (11) has a bottom area (12) lying substantially above the surface (2) of the semiconductor body (1), subjecting the semiconductor body (1) to a planarizing treatment so as to form a substantially planar surface (15), subjecting the semiconductor body (1) to a further treatment so as to expose the semiconductor body (1) and form a field isolating region (17), characterized in that the insulating layer (10) is removed substantially to the bottom area (12) of the trough (11) by means of chemical mechanical polishing using fixed abrasives during the planarizing treatment.

6 Claims, 2 Drawing Sheets

METHOD OF MANUFACTURING A SEMICONDUCTOR DEVICE

The invention relates to a method of manufacturing a semiconductor device, comprising the steps of:
- forming a patterned masking layer of insulating material at a surface of a semiconductor body,
- etching the semiconductor body through the patterned masking layer so as to form a trench in the semiconductor body,
- applying an insulating layer which fills the trench in the semiconductor body, the insulating layer exhibiting a trough above the trench, which trough has a bottom area lying substantially above the surface of the semiconductor body,
- subjecting the semiconductor body to a planarizing treatment so as to form a substantially planar surface,
- subjecting the semiconductor body to a further treatment so as to expose the semiconductor body and form a field isolating region.

Such a method is known from EP-A-0 461 498. In the known method the patterned masking layer comprises a stop layer, which stop layer is formed of, for example, CVD silicon nitride. After formation of the trench and application of the insulating layer, which insulating layer is formed of, for example, CVD silicon oxide, the semiconductor body is subjected to a planarizing treatment, wherein the surface of the insulating layer is polished with a chemical mechanical polisher having a soft semirigid pad saturated with a slurry of abrasive particles such as colloidal silica in an alkaline base and water. The saturated pad is used to rub on the surface of the insulating layer to perform chemical mechanical polishing and erode the insulating layer. The stop layer is adapted to erode much more slowly than the insulating layer. Therefore, when polishing gets to the level of the stop layer, polishing is slowed down. The planarization of the insulating layer is thus provided with a self-stopping feature.

A disadvantage of the known method is that a stop layer formed of, for example, silicon nitride has to be applied for slowing down the planarization of the insulating layer. Such a stop layer is usually removed in a dirty and expensive process step such as, for example, a wet etch step using hot phosphoric acid.

The invention has for its object inter alia to provide a method of manufacturing a semiconductor device of the kind mentioned in the opening paragraph, which method makes it possible to circumvent the application of a stop layer for the planarization of the insulating layer used for trench filling.

According to the invention, this object is achieved in that the insulating layer is removed substantially to the bottom area of the trough by means of chemical mechanical polishing using fixed abrasives during the planarizing treatment. By applying chemical mechanical polishing (CMP) using fixed abrasives, in which CMP technique the abrasive particles are embedded in the polishing pad, instead of conventional CMP, which is carried out using an abrasive slurry combined with a polishing pad, the removal rate at top areas of features is higher while the removal rate at bottom areas of features is much lower. The removal rate at bottom areas of features is even very low when applying CMP using fixed abrasives. Clearly, the faster step height reduction and very low removal rate at bottom areas, which are obtainable by applying CMP using fixed abrasives, make it possible to circumvent the use of a stop layer. When the polishing gets to the bottom areas of the features, the polishing is automatically slowed down.

A preferred embodiment of the method in accordance with the invention is characterized in that
- the patterned masking layer is left at the surface of the semiconductor body after formation of the trench,
- the patterned masking layer is formed of a material with respect to which the insulating layer is not substantially selectively removable during the planarizing treatment.
In this way, the surface of the semiconductor body is protected by the patterned masking layer against contamination during subsequent process steps, which patterned masking layer does not act as a stop layer during the planarizing treatment.

In order to easily adjust the extent to which the field isolating region rises above the surface of the semiconductor body, it is advantageous that
- the patterned masking layer is removed over at most a part of its thickness during the planarizing treatment,
- the patterned masking layer is etched much faster than the insulating layer during the further treatment.

Further advantageous embodiments of the method in accordance with the invention are described in the other dependent claims.

These and other aspects of the invention will be apparent from and elucidated with reference to the embodiments described hereinafter, and shown in the drawing. In the drawing:

FIGS. 1 to 6 show diagrammatic cross-sectional views of successive stages in the manufacture of a semiconductor device using the method in accordance with the invention.

FIGS. 1 to 6 show successive stages in the so-called Shallow Trench Isolation (STI) process, which is used in deep-submicron CMOS technology for electrically insulating semiconductor devices from one another by means of thick field isolating regions. It will be evident to those skilled in the art that the semiconductor devices may be provided as, for example, conventional field effect transistors, memory devices, thin film transistors, active arrays for driving liquid crystal displays (LCD's), or as CMOS or BICMOS integrated circuits, which are known per se.

With reference to FIG. 1, a patterned masking layer 3 of insulating material is formed at a surface 2 of a semiconductor body 1. For this purpose, the surface 2 of the semiconductor body 1 is provided with a relatively thin pad oxide layer 4 and a top layer 5, which pad oxide layer 4 and top layer 5 are patterned to form opening 6 by means of a photoresist mask 7. The top layer 5 is advantageously formed of silicon oxynitride.

After removal of the photoresist mask 7 (FIG. 2), the semiconductor body 1 is etched anisotropically via the opening 6 in the patterned masking layer 3 in order to form a trench 8 in the semiconductor body 1. After formation of the trench 8, the patterned masking layer 3 may be removed from the surface 2 of the semiconductor body 1. However, in order to protect the semiconductor body 1 against contamination during subsequent process steps, the patterned masking layer 3 is advantageously left at the surface 2 of the semiconductor body 1 after formation of the trench 8.

Figure 3:
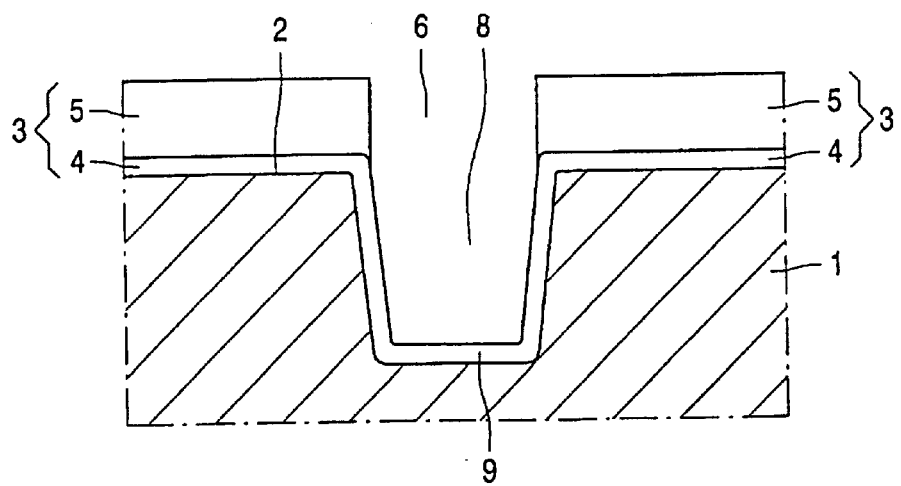

With reference to FIG. 3, a silicon oxide layer 9 is provided on the exposed walls of the trench 8 by means of thermal oxidation at a temperature of, for example, about 1100° C., or by means of wet oxidation using steam at a lower temperature. In order to eliminate damage to the semiconductor body as caused by anisotropic etching, and to provide the trench 8 with a moderate corner radius, the silicon oxide layer 9 may be removed by wet etching using a solution of, for example, 0.5 wt. % hydrofluoric acid (HF) in water, and be grown again.

In a next step (FIG. 4), an insulating layer 10 is applied, which insulating layer 10 fills the trench 8 in the semiconductor body 1. The insulating layer 10 exhibits a trough 11 above the trench 8, which trough 11 has a bottom area 12 lying substantially above the surface 2 of the semiconductor body 1. Next to the trough 11, the insulating layer 10 exhibits top areas 13. In the present example, the bottom area 12 of the trough 11 also lies above the surface 14 of the patterned masking layer 3. This need not be the case, as will be described later. The insulating layer 10 is advantageously formed of high-density plasma (HDP) silicon oxide. It is understood by a person skilled in the art that the number of troughs 11 and, hence, the number of bottom areas 12 present on a semiconductor wafer is in general very large.

Figure 4:
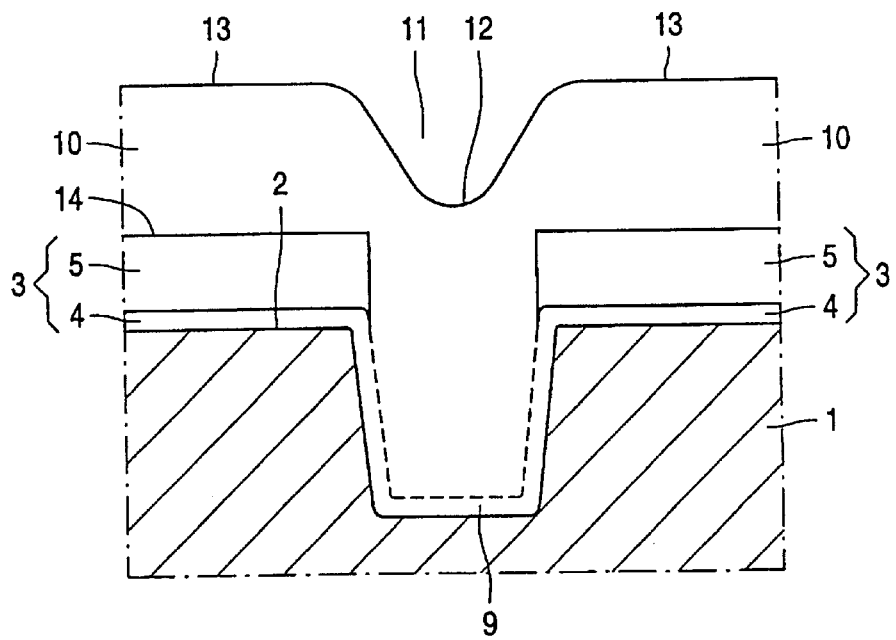
Figure 5:
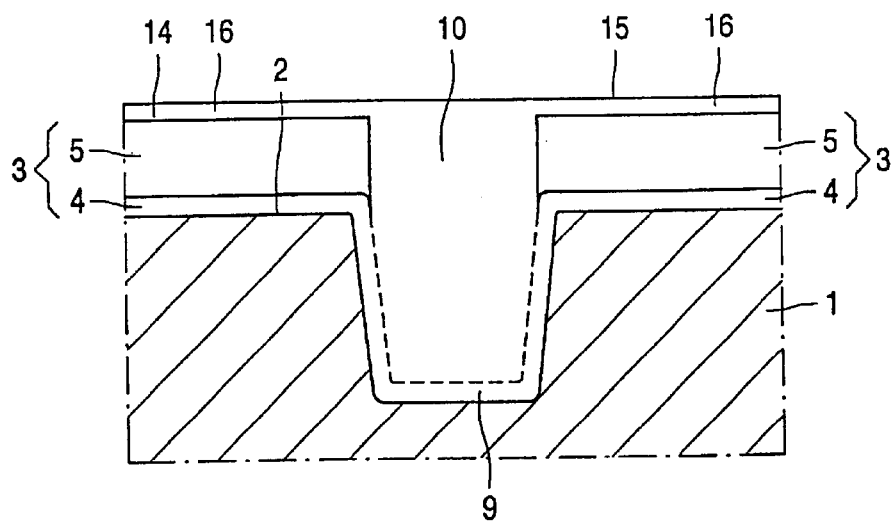

With reference to FIG. 5, the semiconductor body 1 is subjected to a planarizing treatment in order to form a substantially planar surface 15. In the present example, a remainder 16 of the insulating layer 10 is left on top of the patterned masking layer 3. During the planarizing treatment, the insulating layer 10, which is formed of HDP oxide in the present example, is removed substantially to the bottom area 12 of the trough 11 by means of chemical mechanical polishing (CMP) using fixed abrasives. For this purpose a chemical mechanical polisher is used, which is operated with a fixed abrasive polishing pad and a chemical etchant such as, for example, deionized water or a potassium hydroxide (KOH) solution. The fixed (or embedded) abrasive particles may, for example, be cerium oxide particles, which are also referred to as ceria particles. Compared to conventional CMP, which is carried out using an abrasive slurry combined with a polishing pad, the above-mentioned non-conventional CMP technique results in a higher removal rate at top areas of features and in a much lower removal rate at bottom areas of features. The removal rate at the bottom areas is even very low. So, the top areas 13 of the insulating layer 10 (see FIG. 4) are polished much faster than the bottom areas 12 of the insulating layer 10 (only one bottom area shown) when applying the non-conventional CMP technique, that is to say CMP using fixed abrasives. Clearly, the faster step height reduction and very low removal rate at the bottom area(s) 12, which are obtained by applying CMP using fixed abrasives, make it possible to circumvent the use of a stop layer. When the polishing gets to the bottom area(s) 12, the polishing is automatically slowed down.

Figure 6:
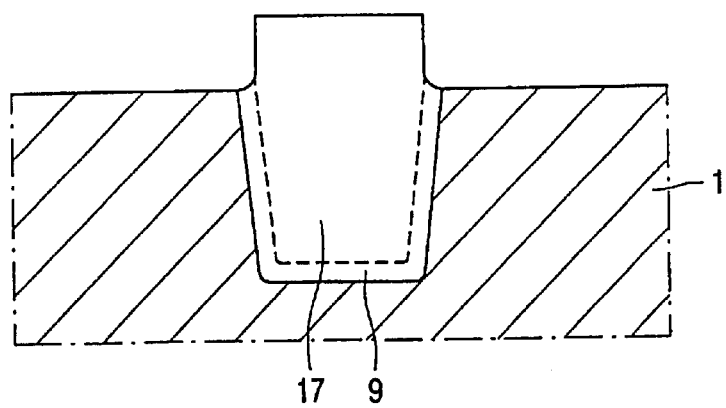

With reference to FIG. 6, the semiconductor body 1 is subjected to a further treatment in order to expose the semiconductor body 1 and form a field isolating region 17. During this further treatment, the remainder 16 of the insulating layer 10, the top layer 5 and the pad oxide layer 4 are removed from the surface 2 of the semiconductor body 1. This can be done in separate process steps. However, in order to simplify the process, the remainder 16 of the insulating layer 10, the top layer 5 and the pad oxide layer 4 are advantageously removed from the surface 2 of the semiconductor body 1 in a single process step by means of, for example, wet etching using, for example, a solution of hydrofluoric acid in water (HF/H$_2$O). Although the concentration of hydrofluoric acid can be chosen such that the insulating layer 10 and the top layer 5 are etched substantially equally fast, the concentration of hydrofluoric acid is advantageously chosen such that the top layer 5, in the present example formed of silicon oxynitride, is etched substantially faster than the insulating layer 10, in the present example formed of high-density plasma (HDP) silicon oxide. For this purpose, a dilute solution of less than 0.01 wt. % HF in water and, preferably, a dilute solution of less than 0.01 wt. % HF in water having a pH of about 2 can be used. The extent to which the final field isolating region 17 rises above the surface 2 of the semiconductor body 1 can be adjusted by changing the concentration of hydrofluoric acid within the above indicated range below 0.01 wt. %.

In the above-described example, the bottom area 12 of the trough 1 lies above the surface 14 of the patterned masking layer 3 (see FIG. 4). However, the bottom area 12 may also be lie substantially above the surface 2 of the semiconductor body 1 or, more specifically, above the surface of the pad oxide layer 4 and below the surface 14 of the patterned masking layer 3. During the subsequent planarizing treatment by means of CMP using fixed abrasives, the insulating layer 10, which is formed of HDP oxide in the present example, is not selectively removed with respect to the top layer 5, which is formed of silicon oxynitride in the present example. In other words, the top layer 5 does not act as a stop layer and, hence, the polishing proceeds until the bottom area 12 of the trough 11 is reached. As a consequence, the top layer 5 of the patterned masking layer 3 is removed over a part of its thickness during the planarizing treatment. During the further treatment, wherein the semiconductor body 1 is exposed and the field isolating region 17 is formed, the remainder of the top layer 5 and the pad oxide layer 4 can be removed from the surface 2 of the semiconductor body 1 in separate process steps. However, in order to simplify the process, the remainder of the top layer 5 and the pad oxide layer 4 are advantageously removed from the surface 2 of the semiconductor body 1 in a single process step by means of, for example, wet etching using, for example, a solution of hydrofluoric acid in water (HF/H$_2$O). The concentration of hydrofluoric acid is advantageously chosen such that the remainder of the top layer 5, in the present example formed of silicon oxynitride, is etched substantially faster than the insulating layer 10, in the present example formed of high-density plasma (HDP) silicon oxide. For this purpose, a dilute solution of less than 0.01 wt. % HF in water and, preferably, a dilute solution of less than 0.01 wt. % HF in water having a pH of about 2 can be used. By changing the concentration of hydrofluoric acid within the above indicated range below 0.01 wt. %, the extent to which the final field isolating region 17 rises above the surface 2 of the semiconductor body 1 can be adjusted.

In the above-described example, the top layer 5 is formed of silicon oxynitride, while the insulating layer 10 is formed of high-density plasma (HDP) silicon oxide. Alternatively, silicon oxide may be used for the top layer 5, while silicon oxynitride may be used for the insulating layer 10. In that case, the remainder 16 of the insulating layer 10, if present, the (remainder of the) top layer 5 and the pad oxide layer can be removed again by, for example, wet etching using, for example, a solution of hydrofluoric acid in water (HF/H$_2$O). The concentration of the hydrofluoric acid is advantageously chosen such that the (remainder of the) top layer 5 formed of silicon oxide is etched substantially faster than the insulating layer 10 formed of silicon oxynitride. For this purpose, a concentrated solution of more than 0.1 wt. % HF in water and, preferably, a concentrated solution of more than 0.1 wt. % HF in water having a pH which is either much higher than 2 or much lower than 2 can be used. The extent to which the final field isolating region 17 rises above the surface 2 of the semiconductor body 1 can be adjusted by changing the concentration of hydrofluoric acid within the above indicated range above 0.1 wt. %.

It will be apparent that the invention is not limited to the embodiments described above, but that many variations are possible to those skilled in the art within the scope of the invention. For example, the pad oxide layer, which is used as the lowermost layer of the patterned masking layer in the above embodiments, may be left out, so that the top layer is directly applied to the surface of the semiconductor body.

What is claimed is:

1. A method of manufacturing a semiconductor device, comprising the steps of:
    forming a patterned masking layer of insulating material at a surface of a semiconductor body,
    etching the semiconductor body through the patterned masking layer so as to form a trench in the semiconductor body,
    applying an insulating layer which fills the trench in the semiconductor body, the insulating layer exhibiting a trough above the trench, which trough has a bottom area lying substantially above the surface of the semiconductor body,
    subjecting the semiconductor body to a planarizing treatment so as to form a substantially planar surface,
    subjecting the semiconductor body to a further treatment so as to expose the semiconductor body and form a field isolating region,
    wherein the insulating layer is removed substantially to the bottom area of the trough by means of chemical mechanical polishing (CMP) using fixed abrasives in a CMP polishing pad during the planarizing treatment.

2. A method as claimed in claim 1, characterized in that
    the patterned masking layer (3) is left at the surface (2) of the semiconductor body (1) after formation of the trench (8),
    the patterned masking layer (3) is formed of a material with respect to which the insulating layer (10) is not substantially selectively removable during the planarizing treatment.

3. A method as claimed in claim 2, characterized in that
    the patterned masking layer (3) is removed over at most a part of its thickness during the planarizing treatment.

4. A method as claimed in claim 1, characterized in that the patterned masking layer (3) is applied by depositing a layer comprising silicon oxynitride, while the insulating layer (10) is applied by depositing a layer comprising high-density plasma silicon oxide.

5. A method as claimed in claim 1, characterized in that the patterned masking layer (3) is applied with a pad oxide layer (4) as the lowermost layer.

6. The method according to claim 1, wherein the planarizing step does not include the use of a stop layer to erode more slowly than the insulating layer.

* * * * *